United States Patent [19]
Zhang

[11] Patent Number: 5,838,530
[45] Date of Patent: Nov. 17, 1998

[54] APPLICATIONS OF PROTECTIVE CERAMICS

[76] Inventor: Guobiao Zhang, P.O. Box 9562, Berkeley, Calif. 94709-0562

[21] Appl. No.: 731,696

[22] Filed: Oct. 17, 1996

Related U.S. Application Data

[60] Provisional application No. 60/022,446 Jul. 22, 1996.

[51] Int. Cl.⁶ .................................. H01G 4/06
[52] U.S. Cl. .................. 361/321.4; 361/322; 257/530; 257/532
[58] Field of Search .................. 361/301.1, 301.4, 361/305, 311, 312, 313, 314, 321.1, 321.2, 321.3, 321.4, 321.5, 322; 257/301, 303, 306, 296, 530, 532, 528; 437/52, 60, 922, 195; 438/250, 253, 239, 240

[56] References Cited

U.S. PATENT DOCUMENTS

| | | | |
|---|---|---|---|
| 4,200,474 | 4/1980 | Morris | 148/1.5 |
| 4,288,470 | 9/1981 | Bate et al. | 427/88 |
| 4,333,808 | 6/1982 | Bhattacharyya et al. | 204/192 |
| 4,432,035 | 2/1984 | Hsieh et al. | 361/322 |
| 4,495,219 | 1/1985 | Kato et al. | 427/82 |
| 4,589,056 | 5/1986 | Stimmell | 361/311 |
| 4,742,025 | 5/1988 | Ohyu et al. | 437/225 |
| 4,899,205 | 2/1990 | Hamdy | 257/530 |
| 4,937,650 | 6/1990 | Shinriki et al. | 257/296 |
| 5,061,971 | 10/1991 | Takemura | 357/5 |
| 5,070,384 | 12/1991 | McCollum et al. | 257/530 |
| 5,079,191 | 1/1992 | Shinriki et al. | 437/235 |
| 5,111,355 | 5/1992 | Anand et al. | 361/322 |
| 5,142,438 | 8/1992 | Reinberg et al. | 361/313 |
| 5,266,829 | 11/1993 | Hamdy et al. | 257/530 |
| 5,373,169 | 12/1994 | McCollum et al. | 257/50 |
| 5,374,832 | 12/1994 | Tung et al. | 257/50 |
| 5,412,244 | 5/1995 | Hamdy et al. | 257/530 |
| 5,432,732 | 7/1995 | Ohmi | 365/149 |
| 5,439,840 | 8/1995 | Jones et al. | 437/52 |
| 5,444,006 | 8/1995 | Han et al. | 437/60 |
| 5,463,244 | 10/1995 | De Araujo et al. | 257/530 |
| 5,482,884 | 1/1996 | McCollum et al. | 437/60 |
| 5,521,423 | 5/1996 | Shinriki et al. | 257/530 |
| 5,552,337 | 9/1996 | Kwon et al. | 437/60 |
| 5,552,627 | 9/1996 | McCollum et al. | 257/530 |
| 5,569,619 | 10/1996 | Roh | 437/52 |

OTHER PUBLICATIONS

E.Irene, "Silicon oxidation studies: some aspects of the initial oxidation regime",*Journal of Electrochemical Society*, vol. 125, No. 10,pp. 1708–1714, Oct. 1978.

J. Gibson et al. "Direct evidence for 1nm pores in dry thermal SiO2 from high resolution transmission electron microscopy",*Journal of Electrochemical Society*, vol. 127, pp. 2722–2728, Dec. 1980.

J.Lee et al. "Comparison between CVD and thermal oxide dielectric integrity",*IEEE Electron Device Letters*, vol. 7, No. 9,pp.506–509, Sep. 1986.

M. Offenberg et al. "Surface etching and roughening in integrated processing of thermal oxides"*Journal of Vacuum Science and Technology A*, vol. 9, No. 3,pp.1058–1065,May/Jun. 1991.

R.Moazami et al. "A high–quality stacked thermal/LPCVD gate oxide technology for ULSI",*IEEE Electron Device Letters*, vol. 14, No. 2, pp. 72–73, Feb. 1993.

J. Li et al. "Accurate determination of defects in the gate oxide of Si metal oxide semiconductor devices by propane infiltration", *Journal of Electrochemical Society*, vol.140, No. 6,pp. L89–92, Jun. 1993.

(List continued on next page.)

*Primary Examiner*—Kristine L. Kincaid
*Assistant Examiner*—Anthony Dinkins

[57] ABSTRACT

It is beneficial for an FPGA, PROM, DRAM and superconductive circuit to use a protective ceramic as its insulating material. This protective ceramic can densely cover metal surface and is free of defects. As a result, a high yield can be ensured. The Pilling-Bedworth ratio is a good indicator of the protective nature of an insulating material. It is desirable to limit the Pilling-Bedworth ratio larger than 1 and preferably smaller than 2. Multiple layers of ceramics can be used to further reduce the defect density and improve yield.

26 Claims, 3 Drawing Sheets

OTHER PUBLICATIONS

C. Yu et al. "Trech doping conformality by plasma immersion ion implantation (PIII)", *IEEE Electron Device Letters*, vol. 15, No. 6, pp. 196–198, Jun. 1994.

E. Palibroda et al. "A new image of porous aluminum oxide", *Materials Science and Engineering B*, vol. B32, No. 1–2, pp. 1–5, Jun. 1995.

Schabowska et al. "Electrical conduction in MIM sandwich structures with $Al_2O_3$ insulating layers", *Thin Solid Films* 75, 1981, pp. 177–180.

Ohji et al. "Ta2O5 capacitors' dielectric material for Gigabit DRAMs", Technical Digest of 1995 Interantional Electron Device Meeting, pp. 111–114, 1995.

APPLICATIONS OF PROTECTIVE CERAMICS

This patent application relates to a provisional patent application, "Applications of Protective Ceramics", provisional patent number 60/022,446, filed on 7/22/96.

BACKGROUND

1. Technical Field of the Invention

This invention relates to integrated circuits, and more particularly to the applications of protective ceramics to antifuses of field programmable gate arrays (FPGA) and programmable read-only memory (PROM), storage capacitors of dynamic random access memory (DRAM) and Josephson Junction of superconductive circuits.

2. Prior Arts

Antifuse is an electrically programmable element used in Field Programmable Gate Arrays (FPGA), programmable read-only memories PROM) and other applications. Its structure is similar to that of a capacitor, i.e. it has an insulating layer sandwiched between two electrodes. This insulating layer, also referred as antifuse layer, renders the antifuse in a high resistance OFF-state before programming. Upon application of an electrical voltage and current, the antifuse is programmed to its ON-state and exhibits a low resistance. This results in an electrical connection between two electrodes.

The insulating material for the antifuse, also referred as the antifuse se material, is the key to the success of antifuse technology. There are millions of antifuses on an FPGA or PROM. They are all expected to have a similar behavior. For example, the unprogrammed antifuses should have small leakage current. If the leakage current of a unprogrammed antifuse becomes so large that two electrodes are effectively shorted together, the FPGA or PROM would perform a wrong logic function. As a result, the manufacturing yield is low. To improve the yield, it is necessary to ensure that the antifuse layer is free of defects. If each antifuse has an area of 1 $\mu m^2$, the total area of antifuses on one FPGA or PROM could be well over 1 $mm^2$. Thus, the quality of the antifuse material should be good enough so that defect-free capacitors up to 1 $mm^2$ can be made.

Metal-to-metal antifuses are extensively studied for the next generation FPGA and PROM. One major challenge is to find a high quality antifuse material. There are growing interest to use thermally grown metal oxide as the antifuse material. For example, U.S. Pat. No. 5,070,384 issued to McCollum, et al on Apr. 12, 1990 describes an antifuse layer using Ti oxide. U.S. Pat. No. 5,374,832 issued to Tung, et al on Dec. 20, 1994 describes the usage of TiW oxide as the antifuse material. Unfortunately, the oxides of Ti and W are not protective oxides, in other words, they are porous and with large defect density (J. Shackelford, *Introduction to Materials Science for Engineers*, 2nd ed. pp. 609–610, 1988). It is questionable if these antifuse materials can achieve an acceptable yield. Therefore, a need has arisen to find an antifuse material with low defect density to achieve a high yield.

Dynamic Random Access Memory (DRAM) is comprised of arrays of memory cells. Each memory cell of contemporary DRAM chips comprises one access transistor and one storage capacitor. The storage capacitor consists of two opposing electrodes and one insulating layer. Information is represented by the electrical charge stored on the storage capacitor.

The state-of-the-art DRAM contains 256 Megabits of information. This means that there are 256 million capacitors on a single DRAM chip! All of these capacitors are expected to have a similar behavior, i.e. they should retain sufficient electrical charge for sufficient time. If the leakage current through the capacitor is too large, retained charge can leak away before the next refreshing cycle. As a result, the stored information is lost. To ensure a proper functionality of a DRAM chip, the leakage current through the storage capacitor has to be controllably and repeatably small. It should be kept into mind that this statement should be true for every single storage capacitor on the DRAM chip.

The integrity of the insulating material is the key to keep the leakage current controllably and repeatably small for every storage capacitor. Defects such as pinholes can cause excessive leakage current. To ensure a reasonable yield, the defect density of the insulating material on a DRAM chip should be limited below a certain level. As a simple estimation, each storage capacitor has an area of 2 $\mu m^2$ and therefore, the total area of the insulating material on a single 1 Gigabit DRAM could exceed 20 $cm^2$. Hence, the defect density in the insulating layer of dynamic memory should be at least below ~1/$mm^2$ if efficient redundancy scheme is utilized.

Silicon oxide/nitride/(oxide) (ON(O)) has been qualified as the insulating material for dynamic memory. It has an excellent record of dielectric integrity. Unfortunately, the dielectric constant of oxide, 3.9, is relatively small. The requirement on capacitance for storage capacitor in 1 Gigabit DRAM is 25–40 fF. If ON(O) is used as the insulating material, the capacitor area for a single memory cell should be at least 2 $\mu m^2$. On the other hand, the cell area for 1 Gigabit DRAM must not exceed 0.2 $\mu m^2$. It is very difficult to reconcile these two requirements on capacitor and cell areas. As a result, more and more attention has been drawn to metal oxides.

In general, metal oxides have large dielectric constant. This makes them suitable for the insulating material of the storage capacitors. Examples of large-$\epsilon$ metal oxides are found in prior art dynamic memory. U.S. Pat. No. 4,937,650, issued to Shinriki, et al on Jun. 26, 1990, U.S. Pat. No. 5,439,840, issued to Jones, et al on Aug. 8, 1995 describe the usage of $Ta_2O_5$, $TiO_2$, etc as the insulating material. Unfortunately, no success has been reported on these materials. The defect density of these materials is high. It was first suspected that defects were introduced during manufacturing. However, usage of advanced tools did not alleviate the problem. In fact, the high level of defects in these materials is not caused by extrinsic factors but by intrinsic ones. $Ta_2O_5$ and $TiO_2$ are intrinsically non-protective oxides, i.e. they intrinsically have a porous structure (J. Shackelford, *Introduction to Materials Science for Engineers*, 2nd ed. pp. 609–610, 1988). Thus, high yield can never be achieved with these materials. In the present invention, protective ceramics are used as the insulating materials to avoid this problem,.

Protective ceramics can also be used for superconductive circuits. Superconductive circuits have attributes such as high speed and low power consumption. Josephson Junction is a key device in superconductive circuits. Its structure is also capacitor-like, i.e. a thin insulating material is disposed between two superconducting materials. This thin insulating material functions as a tunneling layer. The insulating material used in prior art is $Al_2O_3$, which is thermally grown on an Al layer. However, the protectiveness of $Al_2O_3$ was not addressed in prior art. It is desired to have protective ceramics in superconductive circuits.

OBJECTS AND ADVANTAGES

Accordingly, it is a principle object of the present invention to provide a field programmable gate array, programmable read-only memory, semiconductor dynamic memory and superconductive circuit with a high yield.

It is a further object of the present invention to provide an antifuse material with low defect density.

It is a further object of the present invention to provide an antifuse structure with a thin antifuse layer.

It is a further object of the present invention to provide an antifuse structure with a better reliability.

It is a further object of the present invention to provide an antifuse structure with a predictable and controllable breakdown voltage.

It is a further object of the present invention to provide a semiconductor dynamic memory with a high density.

It is a further object of the present invention to provide a semiconductor dynamic memory which can retain electrical charge for a sufficient time.

It is a further object of the present invention to provide a semiconductor dynamic memory with a better reliability.

It is a further object of the present invention to provide a semiconductor dynamic memory with a controllable and repeatable leakage current.

It is a further object of the present invention to provide a field programmable gate array, programmable read-only memory, semiconductor dynamic memory and superconductive circuit which can be manufactured with standard semiconductor processing techniques.

In accordance with these and other objects of the invention, a new class of insulating materials—protective ceramics—is disclosed. Being protective means that this ceramic is not porous and can densely cover the underlying electrode.

SUMMARY OF THE INVENTION

The yield of field programmable gate array, programmable read-only memory, semiconductor dynamic memory and superconductive circuit strongly depends on the integrity of the insulating material. An excessive leakage current on any single antifuse, storage capacitor or Josephson Junction is detrimental to the functionality of the whole circuit. The major cause of excessive leakage current is pinholes. Metallic particles which fall into pinholes can provide an electrical bridge between two opposing electrodes. An ideal insulating material for FPGA, PROM, DRAM and superconductive circuit should be free of pinholes.

To identify possible candidates for pinhole-free insulating materials, it is useful to study some concepts developed in physical metallurgy. To prevent corrosion, physical metallurgy identifies a group of protective coating materials. These protective coating materials are not porous and can densely cover the underlying metals. Thus, no corrosive agent, e.g. oxygen, can transport through these protective coating materials. As a result, no chemical reaction can occur between the corrosive ambient, e.g. oxygen, and the covered metal The key factor to ensure the protectiveness of these coating materials is that they are free of pores or pinholes. Hence, when it is used as the insulating material in integrated circuits such as DRAM, an insulating protective coating material is able to prevent excessive electrical leakage current due to metallic bridging between opposing electrodes. This is simply because the protective coating material is free of pinholes. In sum, the guidelines originally developed in physical metallurgy to identify protective coating materials, especially protective ceramics, can be used to identify the ideal insulating materials that can be used in integrated circuits. An overview of protective ceramics will be disclosed below. This overview can be applied equally well to protective coating materials used in physical metallurgy and protective insulating materials used in integrated circuits.

Ceramics are chemical compounds of at least one metallic element and at least one of five nonmetallic elements (C, N, O, P or S) (Table 1). In this disclosure, ceramics can have either poly-crystalline structure and amorphous structure (amorphous ceramics are also referred as glass). Some representatives are $Al_2O_3$, $Cr_2O_3$, SiC and $Si_3N_4$. In general, ceramics are refractory, i.e. they are chemically stable at high temperature. In other words, they can withstand harsh processing environment.

To identify if a ceramic is intrinsically protective or not, the Pilling-Bedworth ratio (J. Shackelford, *Introduction to Materials Science for Engineers*, 2nd ed. pp. 609–610, 1988) is a valuable figure of merit. The Pilling-Bedworth ratio of a ceramic is defined as the ratio between the volume of said ceramic to the total metal volume consumed to form said ceramic.

$$R = \frac{V_{ceramic}}{V_{metal\ consumed}}.$$

For the Pilling-Bedworth ratio smaller than 1, the ceramic tends to be porous and non-protective, because it cannot cover the whole metal surface. For the Pilling-Bedworth ratio much larger than 1, large compressive stresses are likely to exist in said ceramic. This would lead to ceramic bulking and spalling.

Here, metal oxide will be used as a concrete example to illustrate how to use the Pilling-Bedworth ratio to identify the intrinsic protective nature of a metal oxide. The Pilling-Bedworth ratio R for a metal oxide is defined as the ratio of the volume of the metal oxide, which is produced by the reaction of metal and oxygen, to the metal volume consumed. It is given by $$R = \frac{Md}{amD},$$

where M, D are the molecular weight and density of metal oxide whose composition is $(Metal)_a(oxygen)_b$, m, d are the atomic weight and density of metal. The general nature of the Pilling-Bedworth ratio to predict the intrinsic protective nature of a metal oxide is illustrated in Table 2.

From Table 2, the protective oxides generally have the Pilling-Bedworth ratio R larger than 1 and preferably less than 2. A number of other factors, in addition to R, must be favorable to produce a protective oxide. Similar coefficients of thermal expansion and good adherence between metal oxide and metal are two of these factors.

As a rule of thumb, a protective metal oxide should be formed from a metal which can stay stable in oxygen. A porous metal oxide cannot densely cover the metal surface and therefore cannot stop the metal corrosion in oxygen (air). For example, Cr oxide is an excellent protective coating and insulating material.

So far, intrinsic factors such as Pilling-Bedworth ratio has been introduced to identify the intrinsic protective nature of a metal oxide. If its Pilling-Bedworth ratio is smaller than 1, a metal oxide can not be protective. Thus, no matter how much effort is made to improve its manufacturing process, this metal oxide cannot be used for the insulating material in integrated circuits. This is why titanium oxide was not successfully used in DRAM industry.

On the other hand, when a metal oxide is implemented in integrated circuits, besides intrinsic factors, certain extrinsic factors can also play important roles. These extrinsic factors include substrate preparation and oxide manufacturing process. As an example, the protectiveness of silicon dioxide ($SiO_2$) will be discussed below to illustrate the effect of extrinsic factors.

$SiO_2$ has been studied and used in integrated circuits for decades. It is probably the most ideal insulator used so far. Even though it is known to be an intrinsic protective oxide (Table 2), $SiO_2$ can exhibit pores (pinholes) when it is grown in a dry environment (Gibson et al. "Direct evidence of 1 nm pores in 'dry' thermal $SiO_2$ from high resolution transmission electron microscopy", *Journal of Electrochemical Society*, Vol. 127, No. 12, pp. 2722–2728, December 1980). Numerous publications have addressed ways to improve the protectiveness (integrity) of $SiO_2$ by changing substrate preparation and manufacturing process. For example, Offenberg et al. suggested to treat silicon substrate with UV ozone before growing oxide (Offenberg et al. "Surface etching and roughening in integrated processing of thermal oxides", *Journal of Vacuum Science and Technology A*, Vol. 9, No. 3, pp. 1058–1065, May/June 1991); Moazzami et al. used stacked thermal/LPCVD oxide to reduce pinhole density (Moazzami et al. "A high-quality stacked thermal/LPCVD gate oxide technology for ULSI", *IEEE Electron Device Letters*, Vol. 14, No. 2, pp. 72–73, February 1993).

In sum, to ensure the protectiveness of a metal oxide, intrinsic factors, e.g. Pilling-Bedworth ratio, and extrinsic factors, e.g. manufacturing process, are important. More details will be given in the "Detailed Description of the Preferred Embodiment" section on the manufacturing process and substrate preparation of the protective ceramics.

The foregoing discussion is focused on the oxides of elemental metal. A similar conclusion also holds true for the oxides of metal alloys. For other ceramics such as metal nitrides, carbides, phosphides and sulfides, similar discussion is also valid. Table 3 gives the Pilling-Bedworth ratio for various metal oxides, metal nitrides, metal carbides, metal phosphides and metal sulfides. A list of intrinsic protective ceramics is complied at the end of Table 3.

TABLE 2

Pilling-Bedworth ratio for various metal oxides

| Intrinsic Protective Oxides | Intrinsic Protective Oxides |
|---|---|
| Be-1.59 | Li-0.57 |
| Cu-1.68 | Na-0.57 |
| Al-1.28 | K-0.45 |
| Si-2.27 | Ag-1.59 |
| Cr-1.99 | Cd-1.21 |
| Mn-1.79 | Ti-1.95 |
| Fe-1.77 | Mo-3.40 |
| Co-1.99 | Hf-2.61 |
| Ni-1.52 | Sb-2.35 |
| Pd-1.60 | W-3.40 |
| Pb-1.40 | Ta-2.33 |
| Ce-1.16 | U-3.05 |
|  | V-3.18 |

TABLE 1

Periodic table with glass/ceramic compounds indicated by a combination of one or more metallic elements (in light color) with one or more non-metallic elements (in dark color).

| Li | Be |    |    |    |    |    |    |    |    |    |    | B  |    |    | F  | Ne |
| Na | Mg |    |    |    |    |    |    |    |    |    |    | Al | Si |    | Cl | Ar |
| K  | Ca | Sc | Ti | V  | Cr | Mn | Fe | Co | Ni | Cu | Zn | Ga | Ge | As | Se | Br | Kr |
| Rb | Sr | Y  | Zr | Nb | Mo | Tc | Ru | Rh | Pd | Ag | Cd | In | Sn | Sb | Te | I  | Xe |
| Cs | Ba | La | Hf | Ta | W  | Re | Os | Ir | Pt | Au | Hg | Tl | Pb | Bi | Po | At | Rn |
| Fr | Ra | Ac |    |    |    |    |    |    |    |    |    |    |    |    |    |    |    |

TABLE 3

Pilling-Bedworth ratios for some ceramics formed from elemental metals
(Data calculated from "CRC Handbook for Physics and Chemistry")

|    | Carbide | Nitride | Oxide | Phosphide | Sulfide |    | Carbide | Nitride | Oxide | Phosphide | Sulfide |
|----|---------|---------|-------|-----------|---------|----|---------|---------|-------|-----------|---------|
| Sc |         |         | 1.19  |           |         | Cd |         |         | *1.21* | 1.83     | *2.30*  |
| Ti | 1.14    | 1.11    | *1.95* | 1.88     | *3.27*  | La | 1.44    |         | 1.11  |           |         |
| V  | 1.28    | 1.24    | *3.18* |          | *2.31*  | Hf | 1.16    |         | 2.61  |           |         |
| Cr | 1.24    | 1.55    | 1.99  | 2.02      | 2.40    | Ta | 1.27    | 1.10    | 2.33  |           |         |
| Mn | 1.12    |         | 1.79  |           | 2.86    | W  | 1.32    |         | *3.40* | *2.66*   | *3.48*  |
| Fe | 1.10    | 1.39    | 1.77  | 1.53      | *2.61*  | Re |         |         | 2.11  |           | *3.68*  |
| Co |         |         | 1.99  | 1.76      |         | Os |         |         | 2.31  |           | *3.17*  |
| Ni | 1.19    |         | 1.52  | 1.78      | *2.50*  | Ir |         |         | 2.24  |           | *2.91*  |
| Cu |         | 1.64    | 1.68  | 1.57      | 1.99    | Pt |         |         | 1.56  | *3.14*    | *3.72*  |
| Zn |         | 1.31    | 1.58  | 2.06      | 2.67    | Au |         |         |       | *3.50*    | *2.68*  |
| Y  | 1.37    |         | 1.13  |           |         | Al | 1.53    | 1.26    | 1.29  |           | *3.72*  |
| Zr | 1.08    | 1.05    | 1.47  | *2.26*    | *2.83*  | Ge |         | 1.28    | 1.24  |           |         |
| Nb | 1.27    | 1.17    | 1.37  |           |         | In |         |         | 1.12  |           | 1.80    |
| Mo | 1.40    |         | *3.40* | *2.19*   | *2.59*  | Sn |         |         | 1.01  | 1.11      | 1.40    |
| Ru |         |         | *2.32* |          | *2.88*  | Sb |         |         | *2.35* |          | *2.01*  |
| Rh |         |         | 1.86  |           | *2.84*  | Tl |         |         | 1.29  |           | 1.51    |
| Pd |         |         | 1.60  |           | *4.10*  | Pb |         |         | 1.40  |           | 1.75    |
| Ag |         |         | 1.59  |           | 1.65    | Bi |         |         | *2.14* |          | 1.63    |

Note: the figures in italics refer to non-protective ceramics.

intrinsic protective metal oxides: oxides of Be, Cu, Al, Si, Cr, Mn, Fe, Co, Ni, Pd, Pb, Ce, Sc, Zn, Zr, La, Y, Nb, Rh, Pt;
intrinsic protective metal nitrides: nitrides of Ti, V, Cr, Fe, Cu, Zn, Zr, Nb, Ta, Al, Ge;
intrinsic protective metal carbides: carbides of Ti, Si, V, Cr, Mn, Fe, Ni, Y, Zr, Nb, Mo, La, Hf, Ta, W, Al;
intrinsic protective metal phosphides: phosphides of Ti, Fe, Co, Ni, Cu, Cd, Sn;
intrinsic protective metal sulfides: sulfides of Cu, Ag, In, Sn, Ti, Pb, Bi.

DETAILED DESCRIPTION OF THE PREFERRED EMBODIMENT

Those of ordinary skills in the art will realize that the following description of the present invention is illustrative only and is not intended to be in any way limiting. Other embodiments of the invention will readily suggest themselves to such skilled persons from an examination of the within disclosure.

Figure 1:
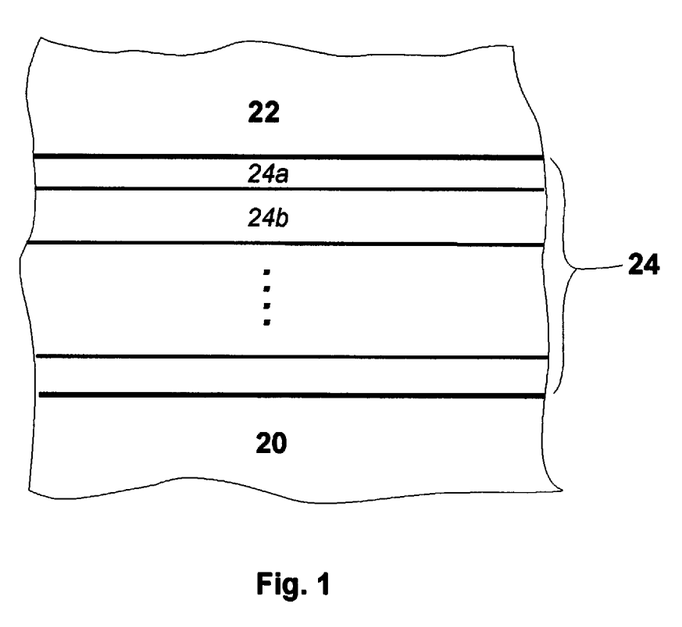
FIG. 1 is a cross-sectional illustration a first application of protective ceramics to antifuses according to the present invention.

FIG. 1 illustrates the first application of protective ceramics to antifuses in FPGA and PROM. The antifuse structure has a bottom electrode 20, a top electrode 22 and an insulating antifuse layer 24. Those of ordinary skills in the art will recognize that the bottom electrode 20 comprises metallic materials. Here, metallic materials include elemental metals, metal alloys and metal compounds. The bottom electrode 20 can also be a composite layer, including an adhesion-promoting layer, a conductive layer, a barrier layer and a base layer. The adhesion-promoting layer is optional. It uses materials such as Ti, TiN, Cr and TiW with a thickness of 100–1000 Å, preferably around 500 Å. It promotes adhesion between the bottom electrode 20 and the underlying layer such as substrate or field oxide. The conductive layer may comprise a metal with good electrical conductivity, such as Al, Cu, Ag and Au. Its thickness is in the range of 1000 Å–2 μm, preferably around 5000 Å. It provides a good conductive path for electrical signals. The barrier layer comprises a refractory metal, such as W, Mo, Ti and TiW. Its thickness is 500–3000 Å, preferably around 1000 Å. It ensures no reaction between the antifuse layer 24 and the conductive layer at the high processing temperature. To those who are familiar with the art, the need for barrier layer strongly depends on the reactivity between the conductive material and the antifuse material. If the antifuse material is chemically stable and does not react with the conductive material at temperature around 450° C., it is not necessary to insert a barrier layer between the conductive layer and antifuse layer 24. A base layer is needed, if the antifuse material is metal oxides formed by oxidizing the top surface of the bottom electrode 20. The base layer is on top of the bottom electrode 20. It comprises elemental metals from which metal oxides are formed. It has a thickness of 50–1000 Å, preferably around 200 Å. For example, a layer of Cr is needed for the base layer if the antifuse material is thermal Cr oxide.

The antifuse layer 24 has one or multiple layers. In this embodiment, there are two layers, 24a and 24b. Among them, at least one layer comprises protective ceramics. The protective ceramics should have the Pilling-Bedworth ratio slightly larger than 1 and preferably less than 2. Some examples are the oxides of Be, Cu, Al, Si, Cr, Mn, Fe, Co, Ni, Pd, Pb and Ce. The thickness of antifuse layer 24 is within the rage of 30 Å and 3000 Å. This can render a programming voltage from 5 to 20 volts for various applications.

The protective ceramics can be formed by either a growing means or a depositing means. The growing means form ceramics by incorporating at least one of the non-metallic elements C, N, O, P, S into the surface of the bottom electrode 20. Thus, ceramics are formed in the bottom electrode 20. The growing means include methods such as thermal oxidation, plasma oxidation, anodization, implantation. On the other hand, the depositing means form ceramics outside the bottom electrode 20. The depositing means include methods such as direct sputtering, reactive sputtering, CVD. These methods are briefly described in the following paragraphs using Cr oxide as an example.

(1) thermal oxidation. Cr oxide is formed in an oxygen ambient at an elevated temperature. This is similar to thermal oxidation of silicon. The thickness Cr oxide can be controlled by varying temperature and oxidation time. References for thermal oxidation include: J. Shackelford, *Introduction to Materials Science for Engineers,* 2nd ed. pp. 607–608, 1988.

(2) plasma oxidation. Cr oxide is formed in an oxygen plasma ambient at room temperature or at an elevated temperature. During plasma oxidation, oxygen ions in the plasma have a better chance to react with Cr. Thus, oxidation process takes much less time. References for plasma oxidation include: Masui, et al "Plasma oxidation of Cu, Ti and Ni and photoelectrochemical properties of the oxide layers formed", *Materials Chemistry and Physics,* 43, no. 3, pp. 283–6, 1996.

(3) anodization. Anodization can be performed in several ways: a. gaseous anodization; b. aqueous anodization; c. solid-state anodization. Gaseous anodization will be illustrated as an example. During a gaseous anodization process, a glow discharge of oxygen is initiated. Then a negative bias is applied on Cr surface with respect to the oxygen glow discharge. As a result, oxygen ions are accelerated towards the Cr surface. With a faster speed, oxygen ions can easily penetrate the existing Cr oxide layer and react with the underlying Cr. Accordingly, a faster growth rate can be achieved. References for anodization include: Schabowska, et al "Electrical conduction in MIM sandwich structures with $Al_2O_3$ insulating layers", *Thin Solid Films,* 75, pp. 177–180, 1981.

(4) Implantation. Oxygen is implanted into the Cr surface. Then a thermal annealing is performed to facilitate the implanted oxygen to react with Cr to form Cr oxide. One feasible approach is to use plasma immersed ion implantation (PIII). This is similar to the process to make SIMOX (silicon-on-insulator using implanted oxygen) wafers but under much lower bias voltage. References for implantation include: Yu, et al "Trench doping conformity by plasma immersion ion implantation (PIII)", *IEEE Electron Device Letters,* 15, no. 6, pp. 196–8, 1994.

(5) direct sputtering. Cr oxide is sputtered in an argon ambient using Cr oxide target. Hydrogen can also be introduced into the deposition chamber during sputtering. This can reduce the dangling bond density of Cr oxide.

(6) reactive sputtering. Instead of using a Cr oxide target, Cr target is used. Cr is sputtered in an ambient of mixed argon and oxygen ions (optionally with hydrogen). On its way from the target to the substrate, Cr reacts with oxygen and Cr oxide is formed.

(7) chemical vapor deposition (CVD). Cr oxide can be formed using a similar CVD method for silicon oxide. Precursor gases are introduced into the reaction chamber and different species of ions react with each other to form Cr oxide.

(8) a combination of all methods mentioned above. Cr oxides made by different methods have different physical structures. Combining various methods can further improve the uniformity of Cr oxide as well as reduce the defect density of Cr oxide. For example, the first half layer of Cr oxide can be formed by thermal oxidation, whereas the second half layer of Cr oxide can be formed by CVD method. Since the pinholes in the first half layer of Cr oxide have very little chance to align with the pinholes in the second half layer, the defect density can be reduced.

Those familiar with the art should note that the insulating material 24 may not contain only single layer of ceramics. A multiple layered structure can be adopted to take advantage of different properties of various ceramics. For example, Cr oxide can be used in combination with Si oxide to further reduce the defect density.

To improve the yield, besides using protective ceramics, the bottom electrode 20 should also be kept free of foreign particles. The sputtered films may contain a large amount of foreign particles. These foreign particles can damage the insulating antifuse layer 24. Thus, the yield could be low. On the other hand, evaporation is a much cleaner process. It introduces fewer foreign particles. Thus, it is desired to use evaporation to form at least a portion of the bottom electrode 20, at least the base layer of the bottom electrode 20. An example is given in Schabowska, et al "Electrical conduction in MIM sandwich structures with $Al_2O_3$ insulating layers", *Thin Solid Films,* 75, pp. 177–180, 1981.

After the formation of the antifuse layer 24, the top electrode 22 is formed and patterned. It may comprise a barrier layer and a conductive layer. The material and thickness of the barrier layer and the conductive layer are similar to those in the bottom electrode 20.

Figure 2:
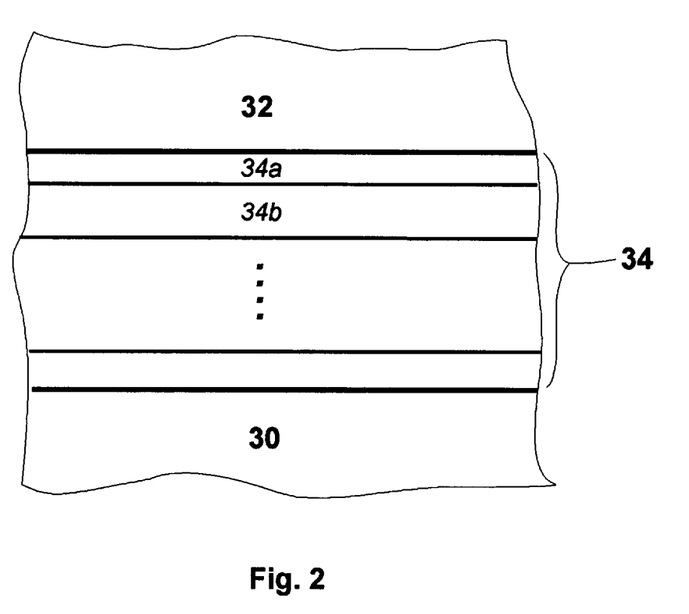
FIG. 2 is a cross-sectional illustration a second application of protective ceramics to storage capacitors in dynamic memory according to the present invention.

Referring now to FIG. 2, the application of protective ceramics to the storage capacitor in DRAM is illustrated. The storage capacitor has a bottom electrode 30, a top electrode 32 and an insulating layer 34. Preferably, the bottom electrode 30 is comprised of refractory metals. This is because the formation of insulating layer 34 might involve some high temperature process (up to 750° C.). If aluminum is used as part of the bottom electrode 30, careful selection of the insulating material 34 is required. Suitable refractory metals are tungsten, platinum,. etc. Alternatively, the bottom electrode 30 could comprises multiple layers of metallic materials. For example, the first layer could be an adhesion-promoting layer. It can be made of materials such TiN, Cr, Ti. The second layer could comprise highly conductive material such as Cu and Al. The thickness of this layer ranges from 2000 Å to 1.5 $\mu$m, preferably 6000 Å. This layer provides a low-resistance path for electrical signals. There could exist a barrier layer on top of the second conductive layer. The barrier layer could be comprised of materials such as TiW, TiN and W. A base layer is needed, if the insulating material 34 is metal oxides formed by oxidizing the top surface of the bottom electrode 30. The base layer is on top of the bottom electrode 30. It comprises elemental metals from which metal oxides are formed. It has a thickness of 50–1000 Å, preferably around 200 Å. For example, a thin layer of Cr is needed for the base layer if the insulating material 34 is thermal Cr oxide. The total preferred thickness of the bottom electrode 30 is 0.2–2 $\mu$m, preferably around 6000 Å.

The insulating material 34 can have a multi-layered structure. For the embodiment shown in FIG. 2, at least one of the insulating materials 34*a* and 34*b* is comprised of protective ceramics. Protective ceramics should have the Pilling-Bedworth ratio slightly larger than 1 and preferably less than 2. Some examples are the oxides of Be, Cu, Al, Si, Cr, Mn, Fe, Co, Ni, Pd, Pb, Zn and Ce. They can be fabricated using the methods described above. The thickness of the insulating material 34 ranges from 20 Å to 3000 Å, preferably around 100 Å. For DRAM applications, it is desirable to have an insulating material 34 with a high dielectric constant. Table 4 shows the dielectric constants $\epsilon$ of some protective metal oxides. Apparently, NiOCoO (50 mole %) is a good candidate for the insulating material for DRAM applications.

After the formation of the insulating material 34, the top electrode 32 is formed and patterned. It may comprise a barrier layer and a conductive layer for semiconductor dynamic memory. The composition and thickness of the barrier layer and the conductive layer are similar to those of the bottom electrode 30.

TABLE 4

Dielectric constant of some protective metal oxides
(Data from "Dielectric data and loss data",
by W. B. Westphal and A. Sils, April 1972)

| Metal | ε of corresponding metal oxide (1 MHz) |
|---|---|
| Be | 7.2 |
| M | 9.98 |
| Cr | 11.4 |
| Ni | 12.9 |
| Co | 11.9 |
| NiO.CoO (50 mole %) | 40 |

Figure 3:
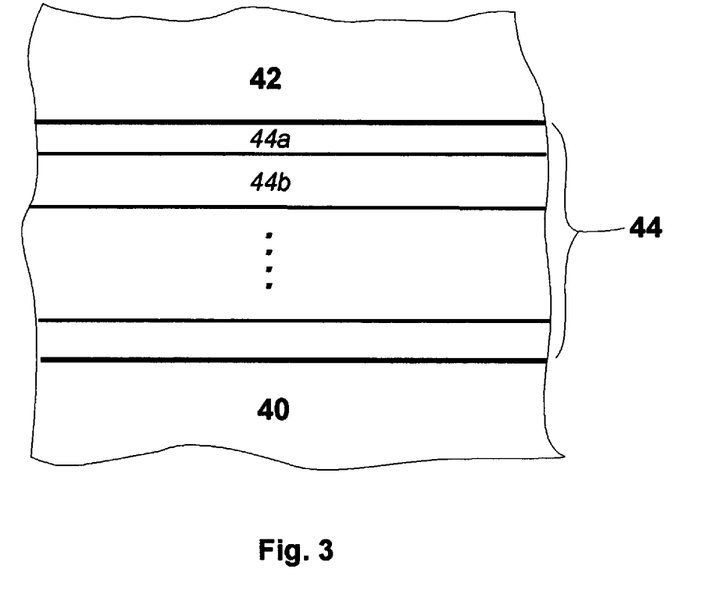
FIG. 3 is a cross-sectional illustration a third application of protective ceramics to Josephson Junctions in superconductive circuits according to the present invention.

FIG. 3 illustrates a Josephson Junction using protective ceramics as its insulating material. For those who are familiar with the art of superconductive circuits and Josephson Junctions, a Josephson Junction comprises a bottom electrode 40, a top electrode 42 and an insulating layer 44. The bottom electrode 40 comprises a superconducting layer and optionally a base layer. The superconducting layer is comprised of niobium or other superconducting materials. It has a thickness of 500 Å–1 μm, preferably around 3000 Å. The base layer comprises metal(s) from which protective ceramics 44a and 44b are formed. It has a similar composition and thickness as that used for DRAM in FIG. 2. The insulating layer 44 functions as a tunneling layer. It comprises at least one layer of protective ceramics. Its thickness is in the range of 20–300 Å, preferably around 70 Å. It can be fabricated using the same method as described in antifuse technology. The top electrode 42 is comprised of superconducting materials with a similar composition and thickness as the bottom electrode 40.

While an illustrative embodiment has been shown and described, it would be apparent to those skilled in the art that more modifications than that have been mentioned above are possible without departing from the inventive concepts set forth therein. The invention, therefore, is not to be limited except in the spirit of the appended claims.

What is claimed is:

1. A capacitor-like device in an integrated circuit comprising
    a first bottom electrode, said first bottom electrode comprising conductive materials, said first bottom electrode having a top surface;
    a second top electrode, said second top electrode comprising conductive materials;
    an insulating layer interposed between said first bottom electrode and said second top electrode, said insulating layer comprising at least one layer of a protective ceramic which is a compound of at least one metallic element and at least one non-metallic element from a group consisting of C, N, O, P, S.

2. The capacitor-like device of claim 1, wherein said protective ceramic has a Piling-Bedworth ratio larger than 1.

3. The capacitor-like device of claim 2, wherein said protective ceramic has a Pilling-Bedworth ratio smaller than 2.

4. The capacitor-like device of claim 1, wherein said protective ceramic comprises a protective metal oxide.

5. The capacitor-like device of claim 4, wherein said protective metal oxide is an oxide of at least one element from a group including Be, Cu, Al, Cr, Mn, Fe, Co, Ni, Pd, Pb, Ce, Sc, Zn, Zr, La, Y, Nb, Rh and Pt.

6. The capacitor-like device of claim 1, wherein said protective ceramic comprises a protective metal nitride.

7. The capacitor-like device of claim 6, wherein said protective metal nitride is a nitride of at least one element from a group including Ti, V, Cr, Fe, Cu, Zn, Zr, Nb, Ta, Al and Ge.

8. The capacitor-like device of claim 1, wherein said protective ceramic comprises a protective metal carbide.

9. The capacitor-like device of claim 8, wherein said protective metal carbide is a carbide of at least one element from a group including Ti, Si, V, Cr, Mn, Fe, Ni, Y, Zr, Nb, Mo, La, Hf, Ta, W and Al.

10. The capacitor-like device of claim 1, wherein said protective ceramic comprises a protective metal phosphide.

11. The capacitor-like device of claim 10, wherein said protective metal phosphide is a phosphide of at least one element from a group including Ti, Fe, Co, Ni, Cu, Cd and Sn.

12. The capacitor-like device of claim 1, wherein said protective ceramic comprises a protective metal sulfide.

13. The capacitor-like device of claim 12, wherein said protective metal sulfide is a sulfide of at least one element from a group including Cu, Ag, I, Sn, Tl, Pb and Bi.

14. The capacitor-like device of claim 22, wherein:
    said top surface of said first bottom electrode comprises at least one metallic element, said metallic element being a metallic component of said protective ceramic;
    at least one portion of said protective ceramic is formed by a growing means, whereby at least one non-metallic element from a group consisting of C, N, O, P, S is incorporated into said top surface of said first bottom electrode.

15. The capacitor-like device of claim 1, wherein:
    said protective ceramic is a protective metal oxide;
    said top surface of said first bottom electrode comprises at least one element from a group including Be, Cu, Al, Cr, Mn, Fe, Co, Ni, Pd, Pb, Ce, Sc, Zn, Zr, La, Y, Nb, Rh and Pt.

16. The capacitor-like device of claim 14, wherein:
    said protective ceramic is a protective metal nitride;
    said top surface of said first bottom electrode comprising at least one element from a group including Ti, V, Cr, Fe, Cu, Zn, Zr, Nb, Ta, Al and Ge.

17. The capacitor-like device of claim 14, wherein:
    said growing means includes thermal oxidation, thermal nitridation, plasma oxidation, plasma nitridation, anodization, and implantation.

18. The capacitor-like device of claim 1, wherein:
    at least one portion of said protective ceramic is formed by a depositing means above said top surface of said first bottom electrode.

19. The capacitor-like device of claim 18, wherein:
    said depositing means includes direct sputtering, reactive sputtering and chemical vapor deposition.

20. The capacitor-like device of claim 1, wherein:
    at least one portion of said bottom electrode is formed by an evaporating means.

21. The capacitor-like device of claim 1, wherein said protective ceramic has a polycrystalline structure.

22. The capacitor-like device of claim 1, wherein said protective ceramic has an amorphous structure.

23. The capacitor-like device of claim 1 further being an antifuse for applications including FPGA and PROM applications.

24. The capacitor-like device of claim 1 further being a capacitor, whereby electrical charge can be accumulated on at least one of said first and second electrodes.

25. The capacitor of claim 24 further being a storage capacitor for applications including DRAM.

26. The capacitor-like device of claim 1 further being a Josephson Junction for applications including superconductive circuit.

* * * * *